US012559861B2

(12) United States Patent
Wang et al.

(10) Patent No.: US 12,559,861 B2
(45) Date of Patent: Feb. 24, 2026

(54) PREPARATION DEVICE AND METHOD FOR SEMI-INSULATING INDIUM PHOSPHIDE

(71) Applicant: THE 13TH RESEARCH INSTITUTE OF CHINA ELECTRONICS TECHNOLOGY GROUP CORPORATION, Shijiazhuang (CN)

(72) Inventors: Shujie Wang, Shijiazhuang (CN);
Niefeng Sun, Shijiazhuang (CN);
Senfeng Xu, Shijiazhuang (CN);
Tongnian Sun, Shijiazhuang (CN);
Huisheng Liu, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 352 days.

(21) Appl. No.: 18/293,137

(22) PCT Filed: Dec. 8, 2021

(86) PCT No.: PCT/CN2021/136320
§ 371 (c)(1),
(2) Date: Jan. 29, 2024

(87) PCT Pub. No.: WO2022/252545
PCT Pub. Date: Dec. 8, 2022

(65) Prior Publication Data
US 2024/0209546 A1     Jun. 27, 2024

(30) Foreign Application Priority Data

Jun. 3, 2021     (CN) ......................... 202110618242.7
Jun. 3, 2021     (CN) ......................... 202110618255.4

(51) Int. Cl.
*C30B 33/02*          (2006.01)
*C30B 29/40*          (2006.01)

(52) U.S. Cl.
CPC .............. *C30B 33/02* (2013.01); *C30B 29/40* (2013.01)

(58) Field of Classification Search
CPC ......... C30B 33/02; C30B 29/40; C30B 15/00; Y10T 117/1068; Y10T 117/1072
See application file for complete search history.

(56) References Cited

U.S. PATENT DOCUMENTS 4,544,417 A     10/1985     Clarke et al.
4,704,257 A     11/1987     Tomizawa et al.
(Continued)

FOREIGN PATENT DOCUMENTS

CN     110760932 A     2/2020
CN     113308740 A     8/2021
(Continued)

OTHER PUBLICATIONS

International Preliminary Report on Patentability mailed on Nov. 21, 2023 in PCT/CN2021/136320, filed Dec. 8, 2021.
(Continued)

*Primary Examiner* — Robert M Kunemund
(74) *Attorney, Agent, or Firm* — AP3 Law Firm PLLC

(57)          ABSTRACT

A preparation device and method of semi-insulated indium phosphide belong to the field of crystal preparation. The preparation device includes a furnace body, and a crucible, an injector and an in-situ annealing device within the furnace body. The method includes: A, heating indium to form an indium melt; B, filling the furnace body with hydrogen of 0.02-0.3MPa and holding the pressure for 1-5 hours, and covering the surface of the melt with liquid boron oxide; C, filling the furnace body with an inert gas of 6-15MPa; D, injecting a phosphorus gas into the indium melt by the injector; E, growing a crystal; and F, annealing the crystal within the in-situ annealing device.

10 Claims, 6 Drawing Sheets

(56)  References Cited

U.S. PATENT DOCUMENTS

| | | | | |
|---|---|---|---|---|
| 5,667,588 | A | * | 9/1997 | Iino ......................... C30B 15/00 117/900 |
| 6,171,395 | B1 | * | 1/2001 | von Ammon ........... C30B 15/00 117/200 |
| 2001/0000814 | A1 | * | 5/2001 | Montgomery ....... G06K 7/0008 710/10 |
| 2005/0066888 | A1 | * | 3/2005 | Griggs ................... C30B 15/20 117/208 |
| 2007/0051303 | A1 | * | 3/2007 | Umeki ................... C30B 29/06 117/900 |
| 2007/0119365 | A1 | * | 5/2007 | Harada .................. C30B 35/00 117/32 |
| 2009/0249998 | A1 | * | 10/2009 | Inami ..................... C30B 15/10 117/217 |

FOREIGN PATENT DOCUMENTS

| | | | |
|---|---|---|---|
| CN | 113308744 | A | 8/2021 |
| CN | 111424310 | A | 2/2022 |
| JP | 2009132587 | A * | 6/2009 |

OTHER PUBLICATIONS

International Search Report and Written Opinion mailed Mar. 1, 2022 in PCT/CN2021/136320, filed Dec. 8, 2021.

* cited by examiner

PREPARATION DEVICE AND METHOD FOR SEMI-INSULATING INDIUM PHOSPHIDE

CROSS-REFERENCE

This application claims the priority of PCT Application Publication No. WO/2022/252545, filed on Dec. 8, 2021, which claims priority to Chinese Patent Application No. 202110618242.7, filed on Jun. 3, 2021 and Chinese Patent Application No. 202110618255.4, filed on Jun. 3, 2021, the entirety of all priority applications is hereby incorporated by reference.

FIELD OF THE INVENTION

The present invention belongs to the field of crystal preparation, in particular to a preparation device and method of semi-insulated indium phosphide.

BACKGROUND OF THE INVENTION

InP material is an important compound semiconductor material, which is one of the preferred materials for preparing high-frequency and high-speed devices, and reflects great advantages in the frequency band above 100 GHz. InP-based microelectronic devices have characteristics of high frequency, low noise, high efficiency, resistance to irradiation, etc. Semi-insulated indium phosphide substrates are widely used in fields such as 5G networks, terahertz communications, millimeter wave communications and detection. Usually, the semi-insulated property of indium phosphide is achieved by doping iron, but iron will reduce the critical shear stress of the crystal, resulting in more defects such as dislocation.

In addition, in terahertz devices, doped elements have a large effect on the dielectric constant of an indium phosphide material. Typically, the higher the doping concentration is, the higher the dielectric constant is, and the lower the radiation frequency is. In order to obtain high-frequency, low-loss terahertz devices, it needs to develop technologies for preparing under-doped or undoped semi-insulated indium phosphide crystals with stable electrical properties.

Indium phosphide can be semi-insulated by annealing. In the prior art, in-situ annealing or on-line annealing after the completion of crystal growth is accomplished in the original growth environment by controlling the temperature gradient, such as Chinese patent with application No. 201610950624.9, and Chinese patent application with application No. 201810801199.6.

Chinese patent with application No. 200610002268.4 proposes "Semi-Insulated GaAs Wafer and Manufacturing Method Thereof", disclosing a fabrication process, but not disclosing related apparatuses.

Since indium phosphide is easy to decompose to form indium and $P_4(g)$, $P_2(g)$ and $P(g)$, etc., $P_4(g)$, $P_2(g)$ and $P(g)$ can be used as protective gases. If annealing is completed still under the original growth environment, as the gases will spread throughout the entire space, when encountering a furnace wall at a relatively low temperature, the gases will be deposited as a solid on the furnace wall to lose the protective effect.

Traditional direct furnace in-situ annealing technologies are not applicable to indium phosphide, and very few direct furnace annealing technologies of indium phosphide exist at present.

SUMMARY OF THE INVENTION

The present invention proposes a preparation device and method of semi-insulated indium phosphide, completing hydrogen atom diffusion, compound generation, crystal growth and in-situ annealing.

In order to achieve the inventive objective, the present invention adopts the following technical solutions.

A preparation device of semi-insulated indium phosphide comprises a furnace body, a crucible and a heating and supporting system disposed in the furnace body, and a seed crystal rod passing through the furnace body; a hydrogen gas tube, an inert gas tube, and an exhaust tube are disposed on the side face of the furnace body; an injector is disposed in the furnace body, and an injection lifting rod connected to the injector protrudes from the furnace body so as to be connected to a driving device; and an in-situ annealing device is also disposed in the furnace body.

The in-situ annealing device comprises an upper seal cover, an upper seal cover driving device, a lower seal cover, a lower seal cover driving device, the lower part of the upper seal cover is open to form an upper seal cover main body, the upper part of the lower seal cover is open, an upper seal cover heating wire is disposed outside the upper seal cover main body, and a lower seal cover heating wire is disposed outside the upper opening of the lower seal cover.

Driven by the upper seal cover driving device and the lower seal cover driving device, the seal cover main body is partially overlapped with the upper opening of the lower seal cover to form an annealing space.

Based on the above device, the present invention also proposes a preparation method of semi-insulated indium phosphide, comprising the following steps:

step A, heating indium to form an indium melt;

step B, filling the furnace body with hydrogen of 0.02-0.3 MPa and holding pressure for 1-5 hours, so that hydrogen atoms are dissolved into the indium melt; and covering the surface of the melt with liquid boron oxide;

step C, filling the furnace body with an inert gas of 6-15 MPa;

step D, by means of the injector, injecting a phosphorus gas into the indium melt to obtain a phosphorus-rich indium-phosphorus melt;

step E, growing a crystal; and step F, after completion of the crystal growth, annealing the crystal in an in-situ annealing device to complete the preparation of semi-insulated indium phosphide.

Crystal growth: at first, hydrogen atoms are diffused into the indium melt under a hydrogen atmosphere, then boron oxide covers the surface of the indium melt, and then phosphorus is rapidly injected into the indium melt using a phosphorus injection method under a certain pressure to form a phosphorus-rich indium-phosphorus melt. After the melt is stable, a seed crystal is lowered to contact the melt for crystal growth.

Since the crystal is grown in a phosphorus-rich and hydrogen-containing melt, the crystal is in a phosphorus-rich state, resulting in forming more indium vacancies in the crystal and forming a $V_{In}H_4$ complex with the H atoms solidly dissolved in the crystal.

In-situ annealing: after completion of the crystal growth, the crystal is raised into the upper seal cover, sealed by the upper seal cover, the liquid seal groove and the lower seal cover, and annealed under a phosphorus atmosphere to achieve the preparation of an under-doped or undoped semi-insulated crystal.

$V_{In}H_4$ has a shallow donor defect that plays a major role in the indium phosphide crystal, $V_{In}H_4$ is decomposed in the annealing process, hydrogen is diffused to the surface of the crystal to enter an atmosphere, indium vacancies and phosphorus vacancies are regenerated in the crystal, and then the generated vacancy defects act with indium and phosphorus in lattices, respectively, to form deep-level defects, indium antisite and phosphorus antisite, which serve as a deep acceptor and a deep donor to jointly compensate a shallow donor and a shallow acceptor in the material, thereby achieving semi-insulated performances of the InP material.

Using the preparation device and method proposed in the present invention can complete the growth of the crystal and achieve the in-situ annealing of the crystal within a suitable space, and especially when annealing under a phosphorus atmosphere is required, it ensures that the phosphorus gas does not condense to maintain the pressure in the annealing space and establish a good annealing environment. Based on the theory related to $V_{IN}H_4$ implemented by conventional undoped semi-insulation, it is proposed that the melt is first smelted under a hydrogen atmosphere to achieve hydrogen absorption, then covered with boron oxide for injection synthesis, which results in a hydrogen-containing indium-phosphorus melt, followed by crystal growth to dope hydrogen atoms into the crystal, and then directly annealed and de-hydrogenated in a hermetically sealed device to achieve semi-insulating properties. The method achieves implementation of synthesis, crystal growth, and undoped semi-insulated properties in one apparatus.

In which, 1: main furnace body; 1-1: chassis; 2: upper furnace body; 3: seed crystal rod; 3-1: auxiliary seed crystal rod; 3-2: liquid seal groove; 3-3: seed crystal holder; 3-4: seed crystal; 4: upper seal cover; 4-1: seed crystal port; 4-2: upper seal cover support; 4-3: liquid seal cap; 4-4: upper seal cover main body; 4-5: storage tank; 5: lifting rod; 5-1: lifting rod right support; 5-2: lifting rod left support; 6: injection lifting rod; 6-1: injection lifting rod right support; 6-2: injection lifting rod left support; 7: injector; 7-1: injector heating wire; 7-2: injection tube; 8: crystal; 9: lower seal cover; 10: boron oxide; 11: crucible; 12: insulation sleeve; 13: boron oxide; 14: indium-phosphorus melt; 15: main heater; 16: graphite support; 17: crucible rod; 18: lower heater; 19: vent tube; 20: boron oxide; 21: pressure gauge; 22: storage chamber; 23: lower seal cover drive; 24: drive rod; 24-1: lower seal cover support; 24-2: fixing cover; 24-3: fixing groove; 24-4: fixing half ring I; 24-5: fixing half ring II; 25: hydrogen tube; 26: inert gas tube; 27: upper seal cover heating wire; 28: lower seal cover heating wire; 29: indium melt; 30: red phosphorus I; and 31: red phosphorus II.

DETAILED DESCRIPTION OF THE EMBODIMENTS

The present invention will be further illustrated below in conjunction with the drawings.

Figures 1, 2:
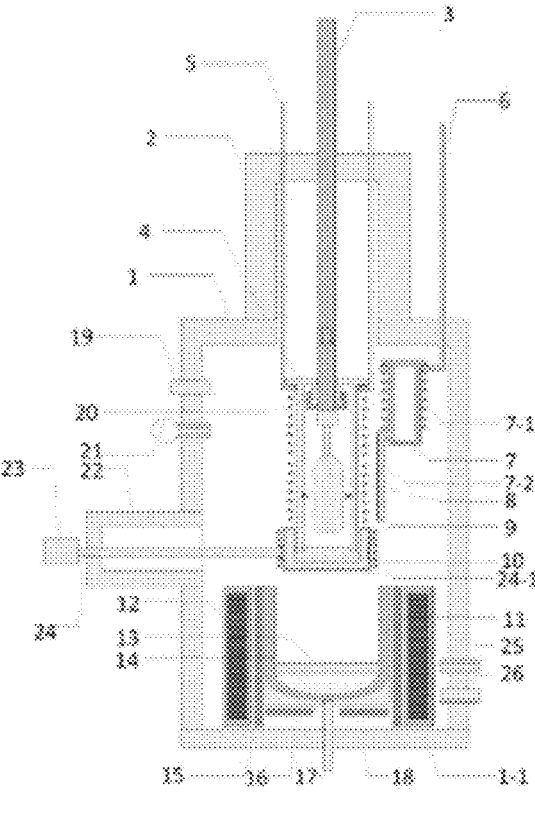
FIG. 1 is a diagram of one of preparation devices.
FIG. 2 is a structure diagram of an injection lifting rod.

Refer to FIG. 1, a preparation device of semi-insulated indium phosphide includes a furnace body, a crucible 11 and a heating and supporting system disposed in the furnace body, a seed crystal rod 3 passing through the furnace body, and a hydrogen gas tube 25, an inert gas tube 26, and an exhaust tube 19 disposed on the side face of the furnace body; an injector 7 is disposed in the furnace body, and an injection lifting rod 6 connected to the injector 7 protrudes from the furnace body so as to be connected to a driving device (not shown in the figure); and an in-situ annealing device is also disposed in the furnace body.

The heating and supporting system for the crucible 11 includes an insulation sleeve 12, a main heater 15, a graphite support 16, a crucible rod 17, and a lower heater 18.

Refer to FIG. 2, the lifting rod 6 is connected to the injector 7 via an injection lifting rod right support 6-1 and an injection lifting rod support left 6-2, an injector heating wire 7-1 is disposed surrounding the injector 7, and the injection tube 7-2 communicates the injector 7 with the inner space of the furnace body.

Figure 3:
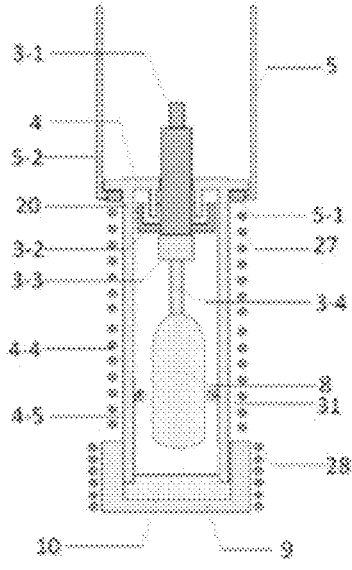
FIG. 3 is a schematic view of in-situ annealing assembly.

Refer to FIG. 3, the in-situ annealing device includes an upper seal cover 4, an upper seal cover driving device, a lower seal cover 9, and a lower seal cover driving device. The lower part of the upper seal cover 4 is open to form an upper seal cover main body 4-4, the upper part of the lower seal cover 9 is open, an upper seal cover heating wire 27 is disposed outside the upper seal cover main body 4-4, and a lower seal cover heating wire 28 is disposed outside the upper opening of the lower seal cover 9.

Driven by the upper seal cover driving device and the lower seal cover driving device, the seal cover main body 4-4 is partially overlapped with the upper opening of the lower seal cover 9 to form an annealing space.

Figure 4:
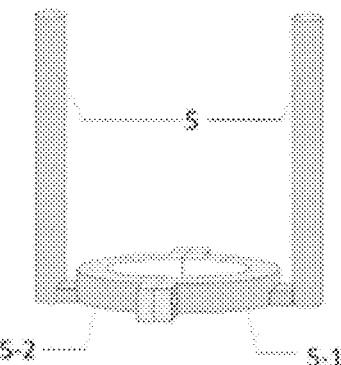
FIG. 4 is a structure diagram of a lifting rod.

Refer to FIG. 4, the upper seal cover driving device includes a lifting rod 5 connected to a driving mechanism and a lifting rod support connected to the lifting rod 5, the lifting rod support is semi-circular lifting rod right support 5-1 and lifting rod left support 5-2, the lifting rod support is connected to fix the upper seal cover 4, and the lifting rod 5 drives the upper seal cover 4 to move up and down.

Figure 5:
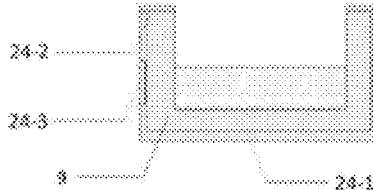
FIG. 5 is a schematic view of a fixing structure for a lower seal cover.
Figure 6:
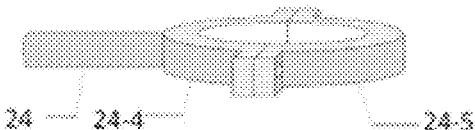
FIG. 6 is a structure diagram of a drive rod and a fixing structure thereof.

Refer to FIGS. 5 and 6, the lower seal cover driving device includes a drive rod 24 connected to the driving mechanism, the drive rod 24 is connected to the lower seal cover 9, and the drive rod 24 drives the lower seal cover 9 to move left and right.

A fixing half ring I 24-4 and a fixing half ring II 24-5 are connected to the lower seal cover support 24-1, and the lower seal cover 9 is placed in the lower seal cover support 24-1. The fixing half ring I 24-4 and the fixing half ring II 24-5 cooperate with a fixing groove 24-3. A fixing cover 24-2 fixes the lower seal cover 9 in the lower seal cover support 24-1.

In order not to affect the normal growth of the crystal, in the present invention, a storage chamber 22 is disposed inside the furnace body, and the space size of the storage chamber 22 is set according to the lower seal cover 9. Refer to FIG. 1.

A drive rod 24 passes through the storage chamber 22 and is connected to a lower seal cover drive 23 externally. The drive rod 24 drives the lower seal cover 9 to recess into and extend from the storage chamber 22.

During the crystal growth, the lower seal cover 9 is recessed into the storage chamber 22 without impact. During annealing, the lower seal cover 9 extends from the storage chamber 22 and cooperates with the upper seal cover 4 to form an annealing space.

Figure 7:
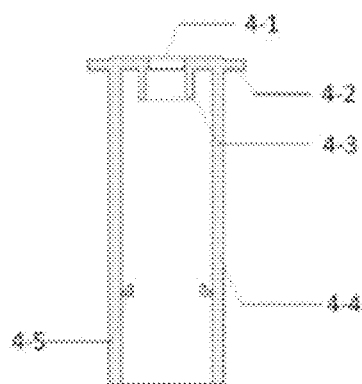
FIG. 7 is a structure diagram of an upper seal cover.

Refer to FIGS. 7 and 1, the top arrangement of the upper seal cover 4 further includes a seed crystal port 4-1, the seed crystal rod 3 is connected to an auxiliary seed crystal rod 3-1, and the auxiliary seed crystal rod 3-1 passes through the seed crystal port 4-1. Such structure can ensure that the crystal enters the seal cover main body 4-4 to complete annealing after completion of the crystal growth.

The upper seal cover 4 further includes a liquid seal cap 4-3.

Figure 8:
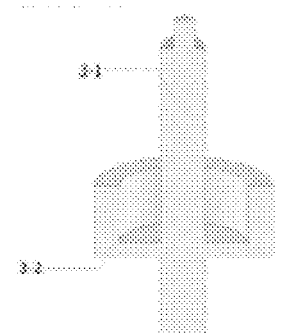
FIG. 8 is a structure diagram of a seed crystal rod.

A liquid seal groove 3-2 is formed in the auxiliary seed crystal rod 3-1 at a position below the upper seal cover 4, as shown in FIG. 8. The liquid seal cap 4-3 enters the liquid seal groove 3-2 when the seal cover main body 4-4 is partially overlapped with the upper opening of the lower seal cover 9.

A storage tank 4-5 is formed in the upper seal cover body 4-4, and a substance for keeping atmosphere, such as red phosphorus, is placed in the storage tank 4-5, so that the gasified red phosphorus fills the entire annealing space after gasified through heating.

When the semi-insulated indium phosphide is prepared, the preparation method of the semi-insulated indium phosphide is as follows.

Figure 9:
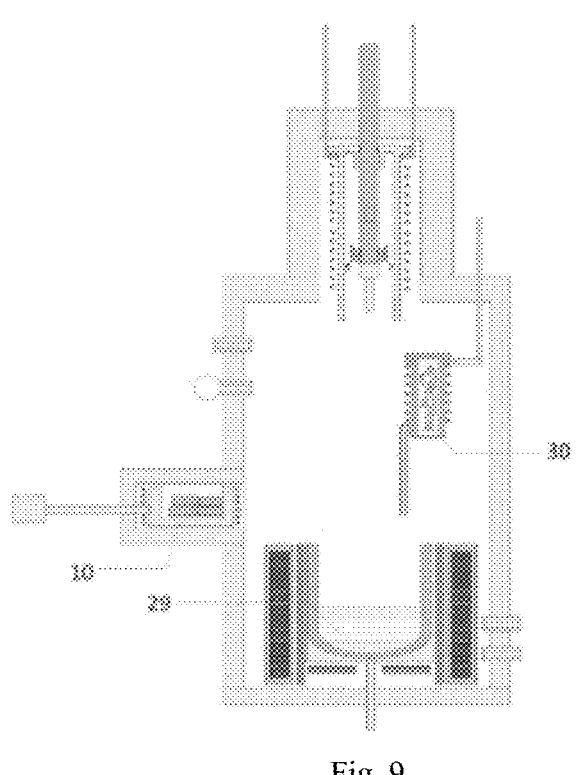
FIG. 9 is a schematic view of hydrogen treatment on an indium melt.

Preparation:

Refer to FIG. 9.

The crucible 11 is loaded with high-purity indium; the lower seal cover 9 is used for placement of boron oxide 10, and the liquid seal groove 3-2 is used for placement of boron oxide 20.

The upper seal cover 4 is lifted up into the upper furnace body 2 by means of the lifting rod 5.

The injector 7 loaded with red phosphorus I 30 passes through the injection lifting rod right support 6-1 and the injection lifting rod left support 6-2 to reach the injection lifting rod 6.

A seed crystal holder 3-3 and a seed crystal 3-4 are assembled on the auxiliary seed crystal rod 3-1, and the auxiliary seed crystal rod 3-1 is connected to the seed crystal rod 3 after passing through the seed crystal port 4-1. The liquid seal groove 3-2 is kept out of contact with the liquid seal cap 4-3.

Figure 10:
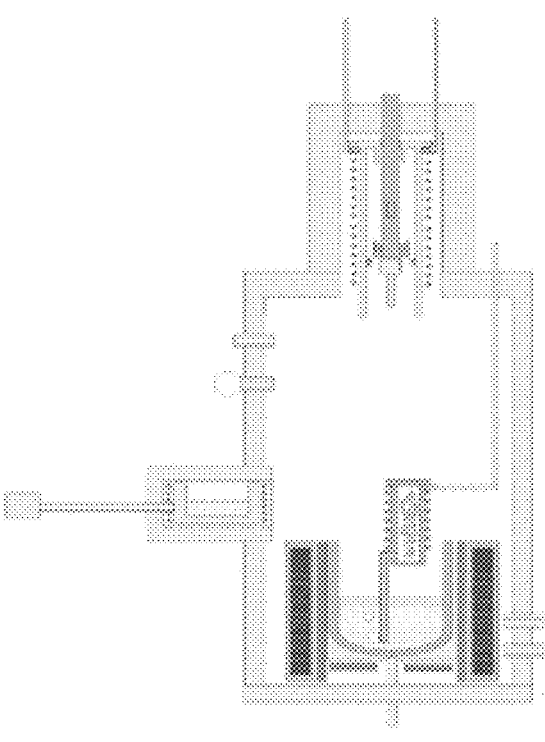
FIG. 10 is a schematic view of injection synthesis.

Melt Synthesis:

Refer to FIG. 10.

The furnace body is vacuumed to $10^{-3}$ Pa.

The high-purity indium in the crucible 11 is heated to 1100-1300° C. via the main heater 15 and the lower heater 18 to form an indium melt 29.

The vacuum system is shut off, and then the furnace body is filled with hydrogen of 0.02-0.1 MPa through the hydrogen tube 25, and the pressure is held for 1-5 hours, allowing the hydrogen atoms to dissolve into the indium melt.

Starting the lower seal cover drive 23, the lower seal cover 9 is delivered to a position right above the crucible 11 through the drive rod 24, and the boron oxide 10 is heated to be in a liquid state through the lower seal cover heating wire 28; and a part of the boron oxide 10 is poured into the crucible 11 through the rotation of the drive rod 24 to form the boron oxide 13 that covers the indium melt 29.

The lower seal cover 9 is rotated to the initial position and placed in the storage chamber 22 to keep the boron oxide 10 in a liquid state.

The furnace body is filled with an inert gas of 6-15 MPa through the inert gas tube 26.

The lifting rod 6 is lowered and rotated to insert the injection tube 7-2 of the injector 7 into the indium melt 29, and heating is performed by the injector heating wire 7-1, so that the red phosphorus I 30 is sublimated and injected into the indium melt 29.

Since the pressure of the inert gas in the environmental atmosphere is greater than the saturated vapor pressure at which the indium-phosphorus melt is proportioned, a phosphorus-rich indium-phosphorus melt 14 can be obtained.

Figure 11:
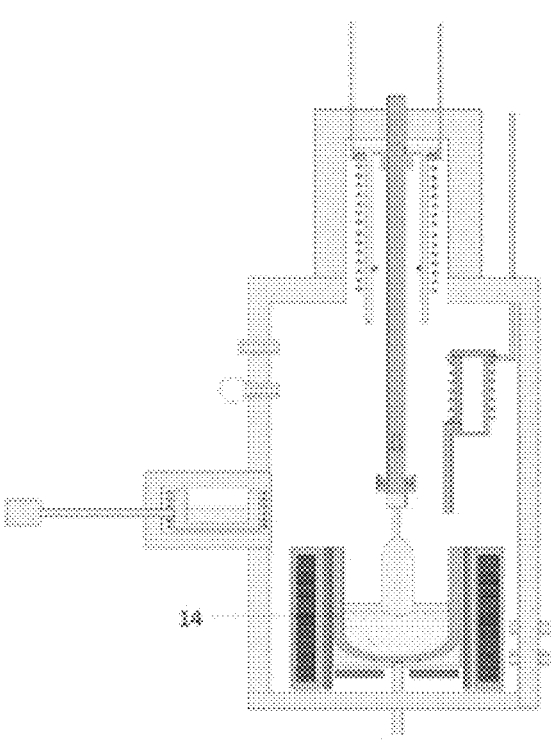
FIG. 11 is a schematic view of crystal growth.

Crystal Growth:

Refer to FIG. 11.

After completion of the synthesis, the injection lifting rod 6 is lifted and rotated to keep the injector 7 and the injection tube 7-2 thereof away from the crucible 11. The auxiliary seed crystal rod 3-1 is lowered, so that the seed crystal 3-4 comes into contact with the indium-phosphorus melt 14, and then the main heater 15 and the lower heater 18 are heated for crystal growth to obtain the crystal 8.

Since the crystal is grown in a phosphorus-rich and hydrogen-containing melt, the crystal is in a phosphorus-rich state, resulting in forming more indium vacancies in the crystal and forming a $V_{In}H_4$ complex with the H atoms solidly dissolved in the crystal.

In-Situ Annealing:

Refer to FIG. 1.

After completion of the crystal growth, the auxiliary seed crystal rod 3-1 is raised to lift up the crystal 8 to the highest position; the lower seal cover drive 23 is initiated to deliver the lower seal cover 9 through the drive rod 24 to a position right below the crystal 8 and right above the upper seal cover 4. The centers of the auxiliary seed crystal rod 3-1, the upper seal cover 4 and the lower seal cover 9 are in a center line.

The upper seal cover 4 is lowered through the lifting rod 5, and the lowering of the upper seal cover 4 is stopped after the liquid seal groove 3-2 enters the heated area of the upper seal cover main body 4-4.

The upper seal cover heating wire 27 performs heating to 500° C., resulting in melting of boron oxide 20 in the liquid seal groove 3-2.

The upper seal cover 4 is continuously lowered until the upper seal cover main body 4-4 is inserted into the boron oxide 10 in the lower seal cover 9.

The auxiliary seed crystal rod 3-1 is lifted up, so that the liquid seal cap 4-3 comes to a point 5-10 mm above the boron oxide 20 in the liquid seal groove 3-2.

The heating of the main heater 15 and the lower heater 18 is stopped such that the indium-phosphorus melt 14 is solidified.

The vent tube 19 is vented to the atmospheric pressure.

Vacuuming is performed until the pressure is $10^{-3}$ pa and then the lifting of the auxiliary seed crystal rod 3-1 is continued, such that the liquid seal cap 4-3 is inserted into the boron oxide 20 in the liquid seal groove 3-2.

At this point, the auxiliary seed crystal rod 3-1, the upper seal cover 4 and the lower seal cover 9 form an annealing seal system and seals the crystal 8 within this system.

The power of the upper seal cover heating wire 27 is adjusted to raise the temperature to the annealing temperature of 850-980° C. at a rate of 10° C. per hour for constant temperature treatment of 10-200 hours. In the temperature rise stage, the furnace body is filled with an inert gas according to formula (1), until the pressure reaches 1 atm.

Red phosphorus II 31 in the storage tank 4-5 starts to sublimate at about 590° C. When the pressure in the annealing seal system is greater than the pressure in the furnace body, the phosphorus gas spills out through the boron oxide 10 and the boron oxide 20 until the pressures in the annealing seal system and the furnace body are balanced.

$$\log_{10}^{P} = -\frac{6070}{T} + 8.67 \qquad (1)$$

in which T is the temperature in the annealing area, in unit of K; and P is the pressure in the furnace, in unit of atm.

When indium phosphide is exposed to high temperature and high pressure, the phosphorus therein will be decomposed. This case can be prevented by creating a phosphorus atmosphere and maintaining a certain pressure.

Formula (1) shows the variation relationship of the saturated vapor pressure of the indium phosphide crystal with the temperature.

As the temperature rises, the red phosphorus placed in the annealing area is decomposed at first, and accordingly the internal pressure is increased, which is P. The pressure inside the furnace is also close to P by filling the outside of the in-situ annealing device with an inert gas, an internal/external pressure balance can be established, which achieves the purpose of preventing excessive phosphorus from spilling out through the boron oxides 10 and the boron oxides 20 while maintaining a phosphorus atmosphere.

$V_{In}H_4$ has a shallow donor defect of dominating in the indium phosphide crystal, $V_{In}H_4$ is decomposed in the annealing process, hydrogen is diffused to the surface of the crystal to enter an atmosphere, indium vacancies and phosphorus vacancies are regenerated in the crystal, and then the generated vacancy defects act with indium and phosphorus in lattices, respectively, to form deep-level defects, indium antisite and phosphorus antisite, which serve as a deep acceptor and a deep donor to jointly compensate a shallow donor and a shallow acceptor in the material, thereby achieving semi-insulated performances of the InP material. Furnace Disassembly:

After completion of the annealing, the temperature is reduced to 500° C. at a cooling rate of 10-50° C. per hour. The upper seal cover 4 is raised, so that the lower seal cover 9 is detached from the upper seal cover main body 4-4, and the liquid seal groove 3-2 is detached from the liquid seal cap 4-3 by a detached distance of 5-10 mm.

The upper seal cover 4 is cooled down to room temperature, then the lower seal cover drive 23 is initiated to stop heating the lower seal cover 9 by delivering the lower seal cover into the storage chamber 22 via the drive rod 24.

The upper seal cover 4 is raised into the upper furnace body 2 through the lifting rod 5; and the gas is vented to the air through the vent tube 19 until atmospheric pressure is achieved. The upper furnace body 2 is disassembled from the main furnace body 1, and the upper furnace body 2 is raised to remove the crystal 8.

With this method, it is possible to obtain semi-insulated properties, with the following electrical parameters: resistivity >2×10$^7$ (Ω·em), mobility >1500 (cm$^2$/V·s), total acceptor impurity content: about 3×10$^{14}$ (cm$^{-3}$). In contrast, after traditional iron doping, it is possible to achieve the electrical parameters of the crystal: in addition to obtaining the above resistivity and mobility, the total acceptor impurity content: >1×10$^{16}$ (cm$^{-3}$). It can be found that in the present invention, not only can semi-insulated properties be achieved, but also the impurity concentration of the material is very low, which is lower than that in the traditional preparation method, and the dislocation density can be reduced by about 30%.

What is claimed is:

1. A preparation device of semi-insulated indium phosphide, comprising a furnace body, a crucible and a heating and supporting system disposed in the furnace body, a seed crystal rod passing through the furnace body, wherein a hydrogen gas tube, an inert gas tube, and an exhaust tube are disposed on a side face of the furnace body; an injector is disposed in the furnace body, and an injection lifting rod connected to the injector protrudes from the furnace body so as to be connected to a driving device; and an in-situ annealing device is also disposed in the furnace body;

the in-situ annealing device comprises an upper seal cover, an upper seal cover driving device, a lower seal cover, and a lower seal cover driving device; a lower part of the upper seal cover is open to form an upper seal cover main body, an upper part of the lower seal cover is open, an upper seal cover heating wire is disposed outside the upper seal cover main body, and a lower seal cover heating wire is disposed outside the upper opening of the lower seal cover; and driven by the upper seal cover driving device and the lower seal cover driving device, the seal cover main body is partially overlapped with the upper opening of the lower seal cover to form an annealing space.

2. The preparation device of semi-insulated indium phosphide according to claim 1, wherein an injector heating wire is disposed surrounding the injector, and the injection tube communicates the injector with the inner space of the furnace body.

3. The preparation device of semi-insulated indium phosphide according to claim 1, wherein the upper seal cover driving device comprises a lifting rod connected to a driving mechanism outside the furnace body and a lifting rod support connected to the lifting rod, the lifting rod support is connected to the upper seal cover, and the lifting rod drives the upper seal cover to move up and down; the lower seal cover driving device comprises a drive rod connected to the driving mechanism, the drive rod is connected to the lower seal cover, and the drive rod drives the lower seal cover to move left and right; a storage chamber is disposed inside the furnace body, and thea space size of the storage chamber is set according to the lower seal cover; and the drive rod drives the lower seal cover to recess into and extend from the storage chamber.

4. The preparation device of semi-insulated indium phosphide according to claim 3, wherein the upper seal cover further comprises a seed crystal port, the seed crystal rod is connected to an auxiliary seed crystal rod, and the auxiliary seed crystal rod passes through the seed crystal port; the upper seal cover further comprises a liquid seal cap; a liquid seal groove is formed in the auxiliary seed crystal rod; and the liquid seal cap enters the liquid seal groove when the seal cover main body is partially overlapped with the upper opening of the lower seal cover.

5. The preparation device of semi-insulated indium phosphide according to claim 4, wherein during operation, boron oxide is disposed in the lower seal cover and the liquid seal groove, and the lower part of the seal cover main body and the lower part of the liquid seal cap are immersed in liquefied boron oxide, respectively, to form liquid seal structures; and a storage tank is formed in the upper seal cover body.

6. A preparation method of semi-insulated indium phosphide, completed based on the preparation device of semi-insulated indium phosphide according to claim 1, wherein the method comprises the following steps:

step A, heating indium to form an indium melt;

step B, filling the furnace body with hydrogen of 0.02-0.3 MPa and holding pressure for 1-5 hours, so that hydrogen atoms are dissolved into the indium melt; and covering the surface of the melt with liquid boron oxide;

step C, filling the furnace body with an inert gas of 6-15 MPa;

step D, by means of the injector, injecting a phosphorus gas into the indium melt to obtain a phosphorus-rich indium-phosphorus melt;

step E, growing a crystal; and step F, after completion of the crystal growth, annealing the crystal in an in-situ annealing device to complete the preparation of semi-insulated indium phosphide.

7. The preparation method of semi-insulated indium phosphide according to claim 6, wherein in step D, the lifting rod is lowered and rotated to insert the injection tube of the injector into the indium melt, and heating is performed by the injector heating wire, so that the red phosphorus in the injector is sublimated and injected into the indium melt.

8. The preparation method of semi-insulated indium phosphide according to claim 6, wherein in step F, the crystal is placed in an annealing space to complete annealing.

9. The preparation method of semi-insulated indium phosphide according to claim 8, wherein in step F, boron oxide is disposed in the lower seal cover and the liquid seal groove, and the lower part of the seal cover main body and the lower part of the liquid seal cap are immersed in liquefied boron oxide, respectively, to form liquid seal structures.

10. The preparation method of semi-insulated indium phosphide according to claim 9, wherein step F is specifically as follows:

step F-1, placing the crystal in the in-situ annealing device to form a seal structure comprises:

after completion of the crystal growth, raising the auxiliary seed crystal rod to lift up the crystal to the highest position;

initiating the lower seal cover drive to deliver the lower seal cover to a position right below the crystal and right above the upper seal cover;

lowering the upper seal cover, and stopping the lowering of the upper seal cover after the liquid seal groove enters the heated area of the upper seal cover main body;

performing heating to melt boron oxide in the liquid seal groove;

lowering the upper seal cover until the upper seal cover main body is inserted into the boron oxide in the lower seal cover;

lifting up the auxiliary seed crystal rod to raise the liquid seal cap to a point 5-10 mm above the boron oxide in the liquid seal groove;

stopping heating the crucible to solidify the indium-phosphorus melt;

venting until the pressure in the furnace body reaches the atmospheric pressure;

vacuuming the furnace body to $10^{-3}$ Pa and continuing the lifting of the auxiliary seed crystal rod, such that the liquid seal cap is inserted into the boron oxide in the liquid seal groove;

step F-2, annealing, comprising:

adjusting the power of the upper seal cover heating wire to raise the temperature to the annealing temperature of 850-980° C. at a rate of 10° C. per hour for constant temperature treatment of 10-200 hours;

in the temperature rise stage, the furnace body is filled with an inert gas according to formula (1), until the pressure reaches 1 atm;

$$\log_{10}^{P} = -\frac{6070}{T} + 8.67 \tag{1}$$

in which T is the temperature in the annealing area, in unit of K; and P is the pressure in the furnace, in unit of atm.

* * * * *